(12) United States Patent
Carver et al.

(10) Patent No.: US 12,013,732 B2
(45) Date of Patent: Jun. 18, 2024

(54) INSERT TO REPLACE A FAN IN HYBRID LIQUID COOLING OF AN INFORMATION HANDLING SYSTEM

(71) Applicant: Dell Products L.P., Round Rock, TX (US)

(72) Inventors: Walter R. Carver, Round Rock, TX (US); Douglas S. Haunsperger, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 340 days.

(21) Appl. No.: 17/574,054

(22) Filed: Jan. 12, 2022

(65) Prior Publication Data

US 2023/0221781 A1  Jul. 13, 2023

(51) Int. Cl.
*H05K 7/20* (2006.01)
*G06F 1/20* (2006.01)

(52) U.S. Cl.
CPC .......... *G06F 1/20* (2013.01); *H05K 7/20136* (2013.01); *H05K 7/20272* (2013.01); *G06F 1/203* (2013.01); *G06F 2200/201* (2013.01)

(58) Field of Classification Search
CPC . G06F 1/20; G06F 2200/201; H05K 7/20136; H05K 7/20272
See application file for complete search history.

(56) References Cited

U.S. PATENT DOCUMENTS

| 5,285,347 A | * | 2/1994 | Fox | G06F 1/20 257/714 |
| 6,955,212 B1 | * | 10/2005 | Hsieh | H01L 23/473 361/698 |
| 7,318,322 B2 | * | 1/2008 | Ota | H05K 7/20781 62/305 |
| 9,215,832 B2 | * | 12/2015 | Chang | H05K 7/20636 |
| 10,746,084 B2 | * | 8/2020 | Sabate | A61B 6/4488 |
| 2008/0164011 A1 | * | 7/2008 | Chen | H01L 23/473 257/E23.098 |
| 2010/0142148 A1 | * | 6/2010 | Nitta | G06F 1/203 361/699 |
| 2012/0055654 A1 | * | 3/2012 | Katsumata | H01L 23/473 165/121 |
| 2017/0181325 A1 | | 6/2017 | Shelnutt et al. | |
| 2018/0235106 A1 | | 8/2018 | Curtis et al. | |
| 2018/0279510 A1 | * | 9/2018 | Johnson | H05K 7/20772 |
| 2020/0042052 A1 | * | 2/2020 | Shabbir | H05K 7/20809 |

* cited by examiner

*Primary Examiner* — Sherman Ng
(74) *Attorney, Agent, or Firm* — Larson Newman, LLP

(57) ABSTRACT

An information handling system includes a first set of components, a second set of components, and a hybrid cooling system. The hybrid cooling system includes a fan structure, a liquid cooling system, and a fan insert. The fan structure includes multiple cooling fans to provide air cooling to the first components of the information handling system. The liquid cooling system provides liquid cooling to one or more of the second components. The liquid cooling system includes a first liquid line routed through an empty fan cavity of the fan structure. The fan insert is located within the empty fan cavity and provides a seal against air-bypass and recirculation within the information handling system.

20 Claims, 6 Drawing Sheets

INSERT TO REPLACE A FAN IN HYBRID LIQUID COOLING OF AN INFORMATION HANDLING SYSTEM

FIELD OF THE DISCLOSURE

The present disclosure generally relates to information handling systems, and more particularly relates to an insert to replace a fan in hybrid liquid cooling of an information handling system.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

SUMMARY

An information handling system includes a first set of components, a second set of components, and a hybrid cooling system. The hybrid cooling system includes a fan structure, a liquid cooling system, and a fan insert. The fan structure includes multiple cooling fans to provide air cooling to the first set of components of the information handling system, and optionally any of the second set of components not cooled by the liquid cooling system. The liquid cooling system may provide liquid cooling to one or more of the second set of components. The liquid cooling system includes a first liquid line routed through an empty fan cavity of the fan structure. The fan insert is located within the empty fan cavity and may provide a seal against air-bypass and recirculation within the information handling system.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

Figure 1:
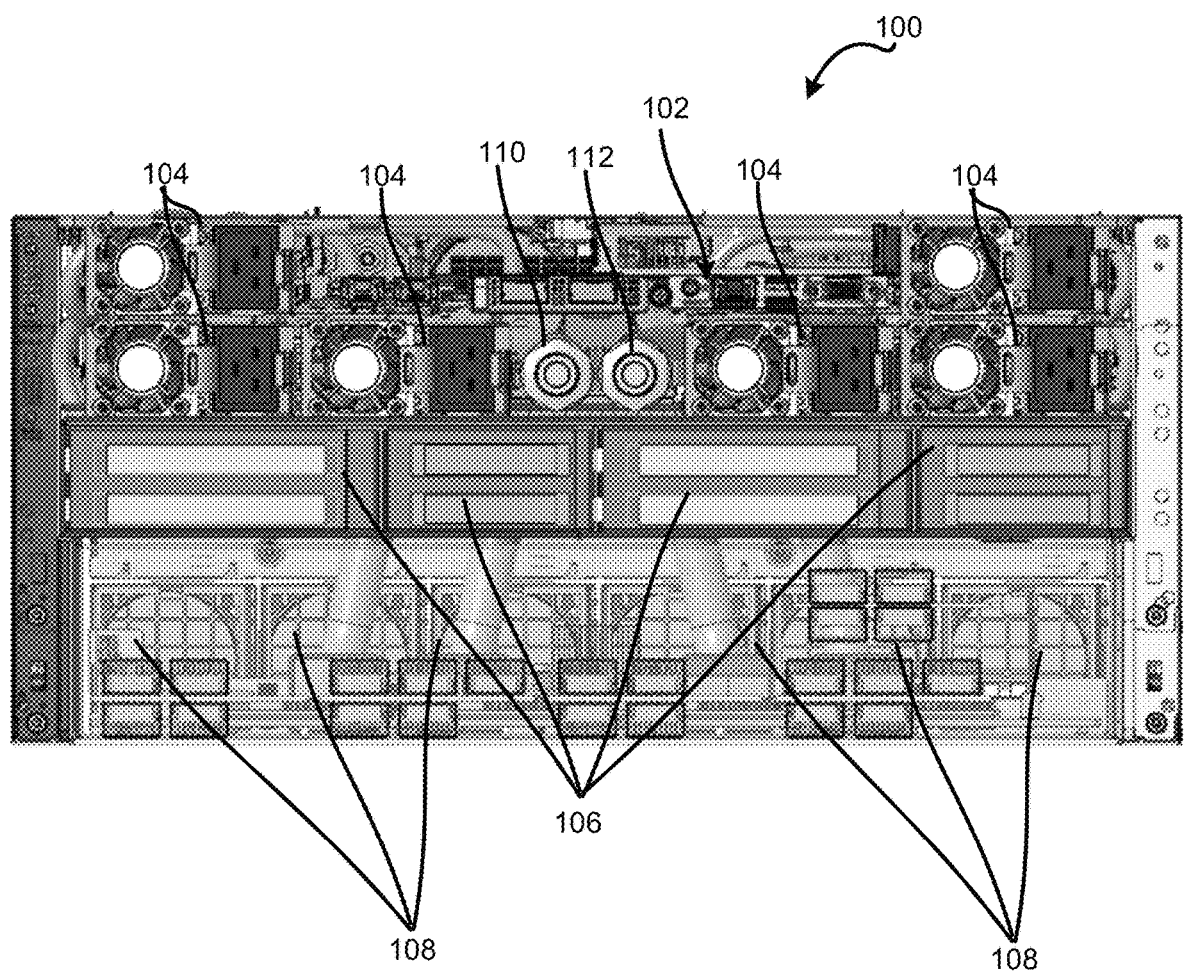
FIG. 1 is a diagram of an information handling system including a hybrid cooling system according to at least one embodiment of the disclosure.

FIG. 1 illustrates a server or information handling system 100 according to at least one embodiment of the disclosure. For purpose of this disclosure information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system can be a personal computer, a laptop computer, a smart phone, a tablet device or other consumer electronic device, a network server, a network storage device, a switch, a router, or another network communication device, or any other suitable device and may vary in size, shape, performance, functionality, and price.

Server 100 may be configured with any suitable number of components or devices, such as a central processor board 102, power supply devices 104, input/output (IO) devices 106, and multiple cooling fans 108. Server 100 may be designed with one of multiple cooling systems, such as an air-cooled system, a liquid-cooled system, and a hybrid cooling system. In an example, the hybrid cooling system may provide the central processor board 102, the power supply devices 104, the IO devices 106, and other components in server 100 with both air cooling and liquid cooling.

Server 100 may be a high performance server, which may be able to accommodate a wide power range of CPUs, GPUs and other high-power components. At lower power levels, these components may be cooled with conventional air-cooling fans. However, at higher power levels one or more of the components may require a liquid cooling solution. In liquid cooling, water or another suitable liquid is carried directly to the one or more of the components through tubing from outside server 100 or from an internal radiator. In situations when one or more of the components in server 100 are liquid cooled, other components in the server, such as power supplies 104, DIMMs, storage devices, and IO devices, may need to be air cooled. In these situations, a hybrid cooling system including both air and liquid cooling may provide the most efficient cooling for the components in server 100.

The liquid cooling of server 100 may be provided by main cold line 110 and a main hot line 112. In an example, flexibility in the design of server 100 to accommodate both air and hybrid cooling solutions without having to redesign the server may improve the server. In previous information handling systems, the cooling system would not be able to pass liquid cooling lines through the fan structure without a complete redesign of the fan support structure and still provide air sealing around the liquid cooling lines. In an example, hybrid cooling system 200 of FIG. 2 may improve server 100 by routing the liquid cooling lines through an existing fan support structure and providing a seal against air-bypass and recirculation within the server.

Figure 2:
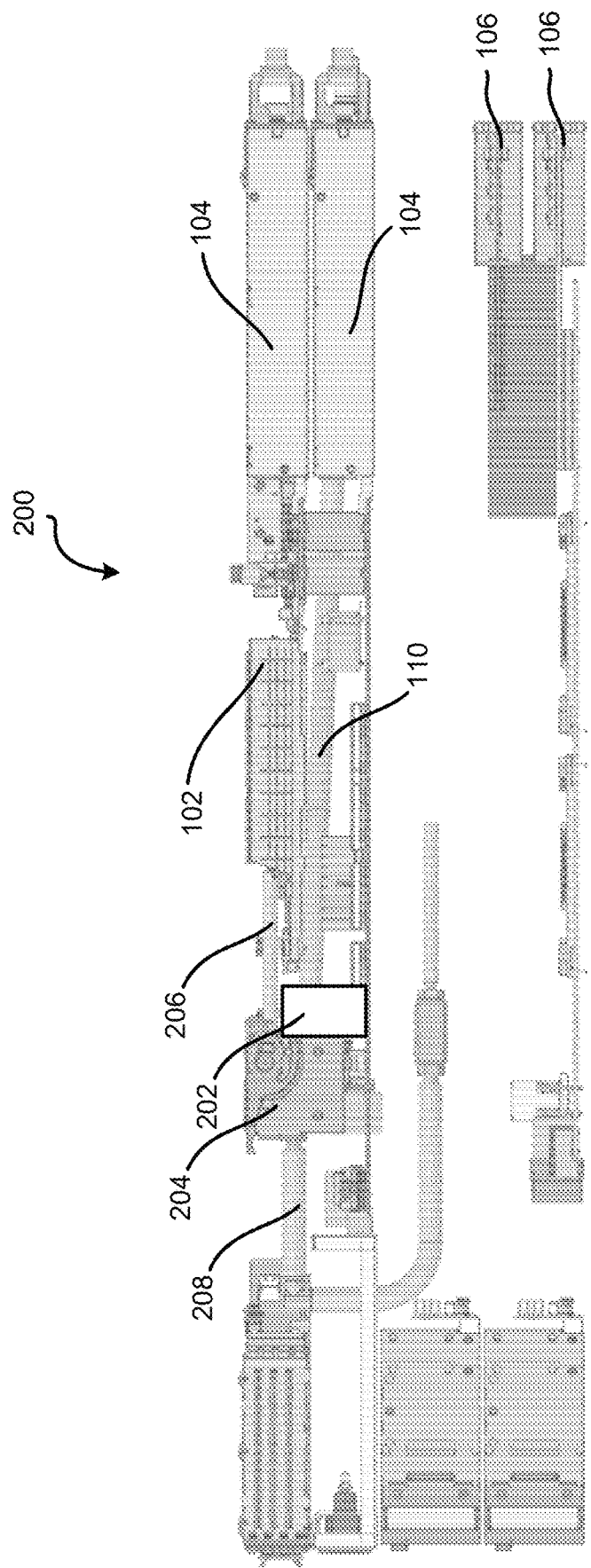
FIG. 2 is a diagram of a portion of the information handling system including the hybrid cooling system according to at least one embodiment of the present disclosure.

FIG. 2 illustrates a hybrid cooling system 200 of information handling system, such as information handling system 100 of FIG. 1, according to at least one embodiment of the present disclosure. Hybrid cooling system 200 includes an internal manifold 202, a fan structure 204, a CPU cold liquid line 206, and an GPU cold liquid line 208. In an example, main cold liquid line 110 may be routed among power devices 104, as shown in FIG. 1, and extend to manifold 202.

In an example, manifold 202 may include one or more outputs to provide cold water to one or more devices in server 100. For example, CPU cold liquid line 206 may be coupled to manifold 202 to provide cold water to CPU board 102. In certain examples, GPU cold liquid line 208 may be routed to IO devices 106 in any suitable manner. For example, GPU cold liquid line 208 may be routed through fan structure 204 to enable the GPU cold liquid line to be routed to IO devices 106 as will be described in greater detail with respect to FIG. 4 below.

Figure 3:
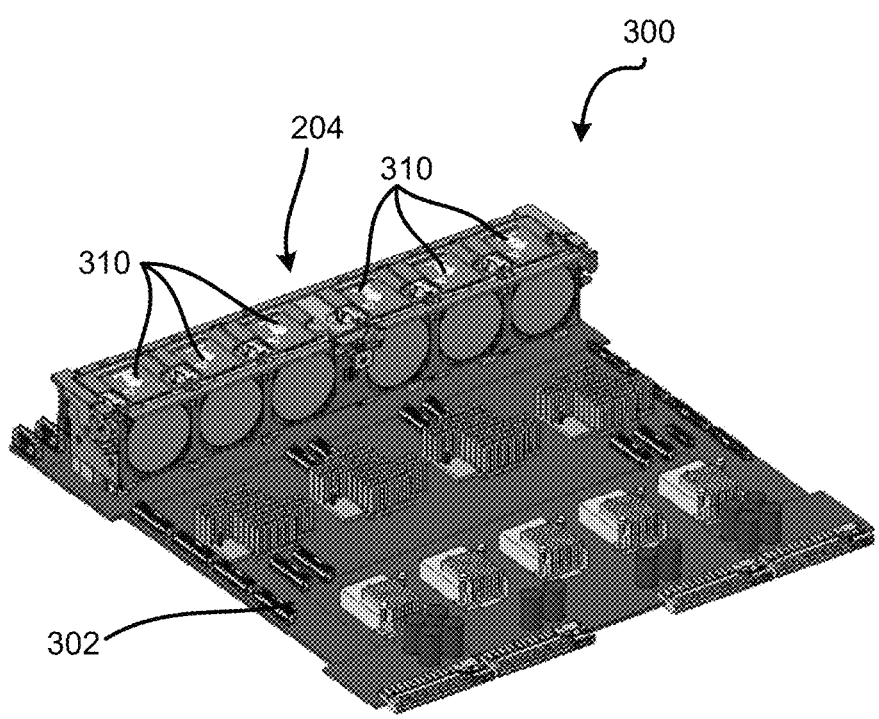
FIG. 3 is a diagram of the information handling system configured only with an air cooled system according to at least one embodiment of the present disclosure.

FIG. 3 illustrates a portion of an information handling system 300 configured only with an air cooled system according to at least one embodiment of the present disclosure. In an example, the portion of information handling system 300 may be located within any information handling system, such as server 100 of FIG. 1. Information handling system 300 includes a memory board 302 and fan structure 204, which in turn includes multiple fans 310. In an example, the devices on memory board 302 may be sufficiently cooled through air cooling. In this example, fans 310 may cool the devices on memory board 302. In certain examples, a server 100 may include additional components that need additional cooling beyond what fans 310 may provide. In this situation, a liquid cooling system may be added to produce a hybrid cooling system as shown in FIG. 4.

Figure 4:
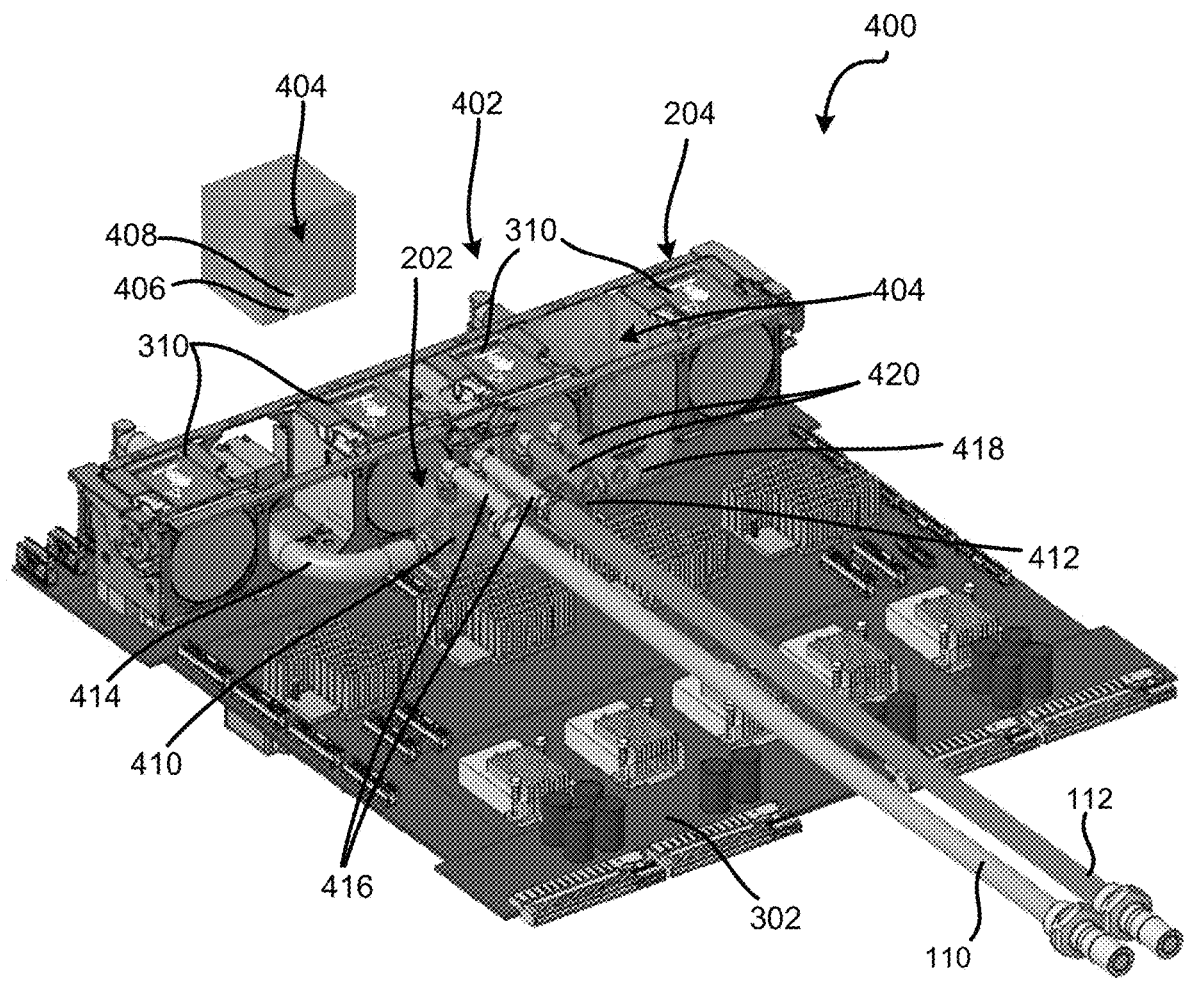
FIG. 4 is a diagram of the information handling system configured with the hybrid cooling system according to at least one embodiment of the present disclosure.

FIG. 4 illustrates an information handling system 400 configured with a hybrid cooling system 402 according to at least one embodiment of the present disclosure. Hybrid cooling system 402 includes fan inserts 404, manifold 202, fan structure 204, main cold liquid line 110, and main hot liquid line 112. Fan inserts 404 include a slot 406 and a notch 408. Manifold 202 may be split into two parts: a cold manifold 410 and a hot manifold 412.

Main cold liquid line 110 may be a supply line for cold manifold 410, and one or more lines by be outlets for the cold manifold. For example, a cold line 414 and one or more CPU cold lines 416 may be outlets from cold manifold 410. Main hot liquid line 112 may be return line from hot manifold 412 to a radiator for the liquid cooling system. In an example, hot line 418 may return hot water from a GPU board to hot manifold 412 and one or more CPU hot lines 420 may return hot water from CPU board 104 to the hot manifold 412.

In an example, the components on memory board 302 may be cooled without all fans 310 within fan structure 204. In this situation, one or more of fans 310 may be removed from fan structure 204 and the components on memory board 302 may receive necessary cooling from the remaining fans in the fan structure. In certain examples, cold line 414 and hot line 418 may be routed through fan structure 204, such as through the one or more empty fan cavities where the one or more fans 310 were removed from the fan structure. In an example, cold line 414 and hot line 418 may be routed through the same empty fan cavity. In another example, cold line 414 may be routed through one empty fan cavity and hot line 418 may be routed through a different empty fan cavity.

The one or more empty cavities within fan structure 204 may create an air-bypass or air recirculation of the cooling airflow within information handling system 400. In this example, the air-bypass or air recirculation of the cooling airflow may reduce the cooling of the air-cooled components within information handling system 400. Information handling system 400 may be improved by fan inserts 404 being placed within the one or more empty fan cavities of fan structure 204 to prevent air-bypass or air recirculation of the cooling airflow. In an example, as fan insert 404 is placed within an empty cavity, the liquid line, such as cold liquid line 414, may slip through slot 406 and snap fit within notch 408 of the fan insert. The size and shape of fan insert 404 may be substantially similar to the size and shape of the empty fan cavity, such that the fan insert may seal the empty fan cavity to prevent air-bypass or air recirculation of the cooling airflow. In an example, fan inserts 404 enable the hybrid cooling system to provide both air cooling and liquid cooling within an existing fan structure 204.

In an example, fan insert 404 may be any suitable material to fill the empty fan cavity including, but not limited to, a foam material and a rubber material. In certain examples, fan insert 404 may or may not include notch 408 based on the rigidity of the material. For example, a more rigid fan insert 404 may need notch 408 and a less rigid fan insert may not need the notch. The less rigid fan insert 404 may be able to conform to fill the empty fan cavity and completely surround the liquid cooling tubing, such as cold liquid line 414 or hot liquid line 418. In an example, fan insert 404 may be a spray foam.

Figure 5:
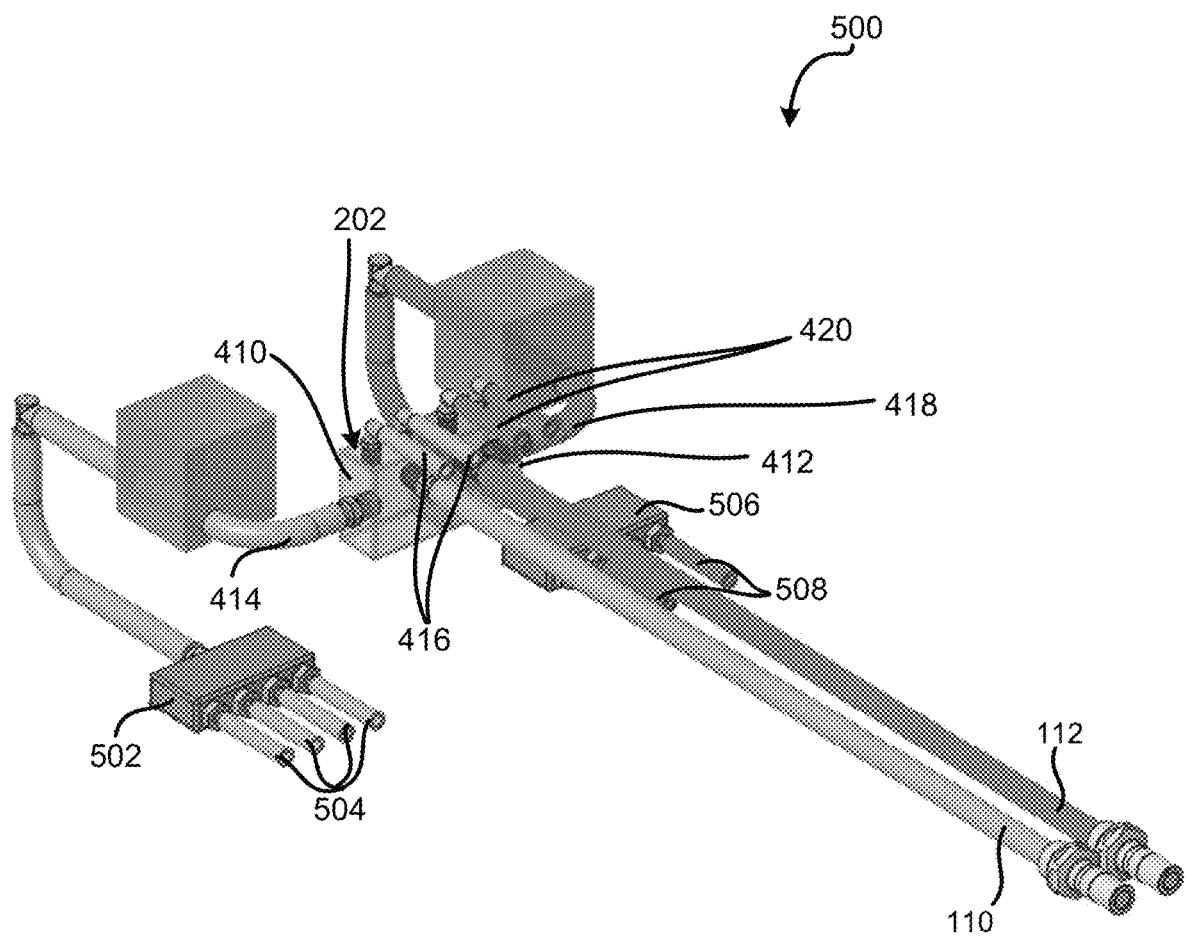
FIG. 5 is a diagram of a liquid cooling portion of the hybrid cooling system according to at least one embodiment of the present disclosure.

FIG. 5 is a liquid cooling portion 500 of the hybrid cooling system according to at least one embodiment of the present disclosure. Liquid cooling portion 500 includes a cold liquid distribution unit 502, multiple cold liquid lines 504, a hot liquid convergence unit 506, multiple hot liquid lines 508, main inlet line 110, main outlet line 112, manifold 202, cold liquid line 414, CPU liquid line 416, hot liquid line 418, and CPU hot liquid line 420. In an example, cold liquid line 414 may provide cold liquid from cold manifold 410 to cold liquid distribution unit 502, which in turn may provide the cold liquid to cold liquid lines 504. Cold liquid lines 504 may provide cold liquid to multiple components within an information handling system, such as server 100 of FIG. 1. Hot liquid lines 508 may provide a return liquid flow from the components of the information handling system to hot liquid convergence unit 506, which in turn may provide the return hot liquid to hot manifold 412 via hot liquid line 418.

While the disclosure has been discussed with respect to water being utilized in the liquid cooling, one of ordinary skill in the art would recognize that any suitable liquid may be utilized without varying from the scope of this disclosure.

Figure 6:
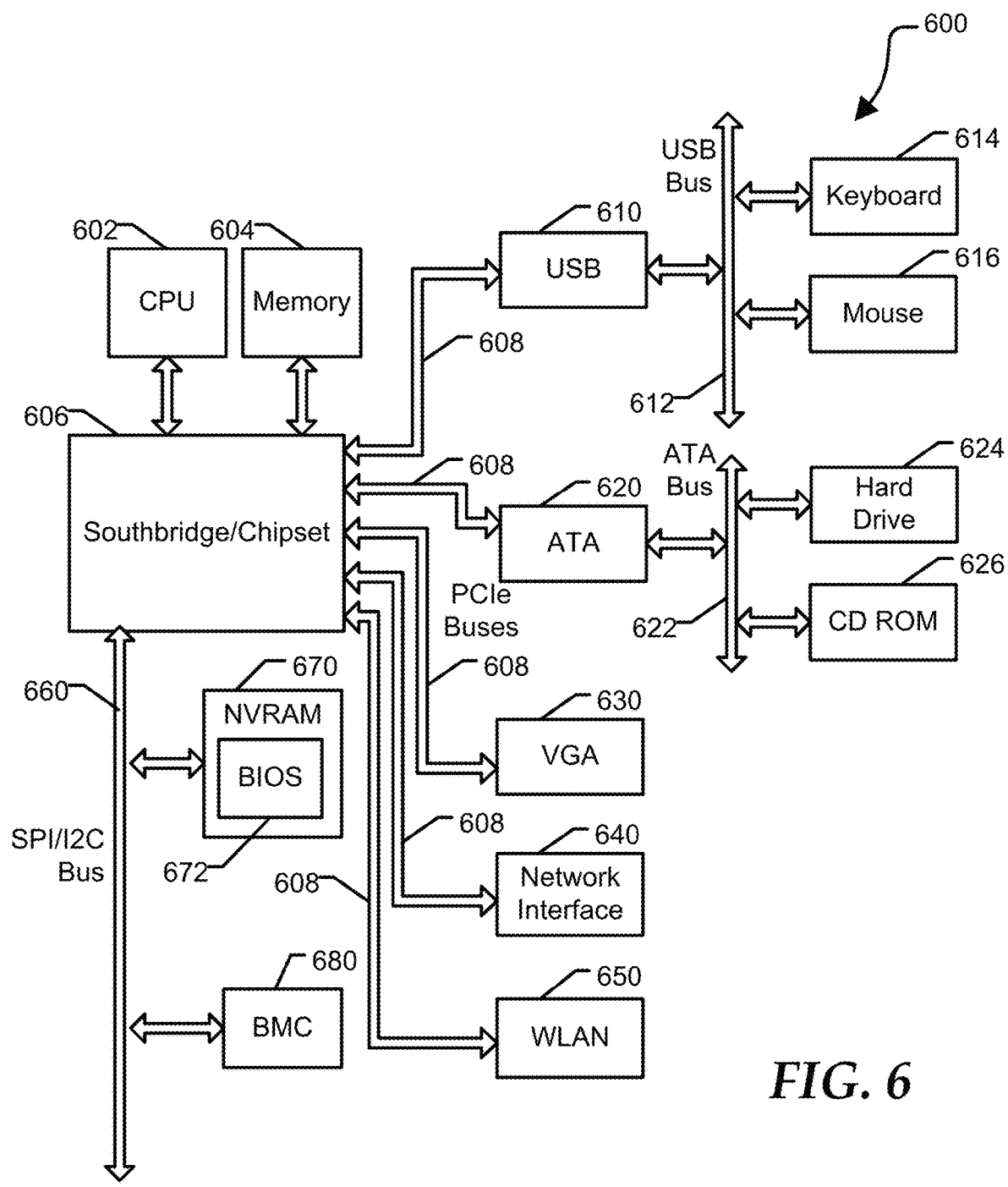
FIG. 6 is a block diagram of an information handling system according to an embodiment of the present disclosure.

FIG. 6 illustrates an information handling system 600 including a processor 602, a memory 604, a chipset 606, a PCI bus 608, a universal serial bus (USB) controller 610, a USB 612, a keyboard device controller 614, a mouse device controller 616, a configuration database 618, an ATA bus controller 620, an ATA bus 622, a hard drive device controller 624, a compact disk read only memory (CD ROM) device controller 626, a video graphics array (VGA) device controller 630, a network interface controller (NIC) 640, a wireless local area network (WLAN) controller 650, a serial peripheral interface (SPI) bus 660, a flash memory device 670 for storing BIOS code 672, a trusted platform module (TPM) 680, and a baseboard management controller (EC) 690. EC 690 can be referred to as a service processor, and embedded controller, and the like. Flash memory device 670 can be referred to as a SPI flash device, BIOS non-volatile random access memory (NVRAM), and the like. EC 690 is configured to provide out-of-band access to devices at information handling system 600. As used herein, out-of-band access herein refers to operations performed without support of CPU 602, such as prior to execution of BIOS code 672 by processor 602 to initialize operation of system 600.

Information handling system 600 can include additional components and additional busses, not shown for clarity. For example, system 600 can include multiple processor cores, audio devices, and the like. While a particular arrangement of bus technologies and interconnections is illustrated for the purpose of example, one of skill will appreciate that the techniques disclosed herein are applicable to other system architectures. System 600 can include multiple CPUs and redundant bus controllers. One ore more components can be integrated together. For example, portions of chipset 606 can be integrated within CPU 602. In an embodiment, chipset 606 can include a platform controller hub (PCH). System 600 can include additional buses and bus protocols, for example I2C and the like. Additional components of information handling system 600 can include one or more storage devices that can store machine-executable code, one or more communications ports for communicating with external devices, and various input and output (I/O) devices, such as a keyboard, a mouse, and a video display.

For purpose of this disclosure information handling system 600 can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 600 can be a personal computer, a laptop computer, a smart phone, a tablet device or other consumer electronic device, a network server, a network storage device, a switch, a router, or another network communication device, or any other suitable device and may vary in size, shape, performance, functionality, and price. Further, information handling system 600 can include processing resources for executing machine-executable code, such as CPU 602, a programmable logic array (PLA), an embedded device such as a System-on-a-Chip (SoC), or other control logic hardware. Information handling system 600 can also include one or more computer-readable medium for storing machine-executable code, such as software or data.

BIOS code 672 can be referred to as a firmware image, and the term BIOS is herein used interchangeably with the term firmware image, or simply firmware. In an embodiment, BIOS 672 can be substantially compliant with one or more revisions of the Unified Extensible Firmware Interface (UEFI) specification. As used herein, the term Extensible Firmware Interface (EFI) is used synonymously with the term UEFI. The UEFI standard replaces the antiquated personal computer BIOS system found in some older information handling systems. However, the term BIOS is often still used to refer to the system firmware. The UEFI specification provides standard interfaces and interoperability guidelines for devices that together make up an information handling system. In particular, the UEFI specification provides a standardized architecture and data structures to manage initialization and configuration of devices, booting of platform resources, and passing of control to the OS. The UEFI specification allows for the extension of platform firmware by loading UEFI driver and UEFI application images. For example, an original equipment manufacturer can include customized or proprietary images to provide enhanced control and management of the information handling system 600. While the techniques disclosed herein are described in the context of a UEFI compliant system, one of skill will appreciate that aspects of the disclosed systems and methods can be implemented at substantially any information handling system having configurable firmware.

BIOS code 672 includes instructions executable by CPU 602 to initialize and test the hardware components of system 600, and to load a boot loader or an operating system (OS) from a mass storage device. BIOS code 672 additionally provides an abstraction layer for the hardware, i.e. a consistent way for application programs and operating systems to interact with the keyboard, display, and other input/output devices. When power is first applied to information handling system 600, the system begins a sequence of initialization procedures. During the initialization sequence, also referred to as a boot sequence, components of system 600 are configured and enabled for operation, and device drivers can be installed. Device drivers provide an interface through which other components of the system 600 can communicate with a corresponding device.

The storage capacity of SPI flash device 670 is typically limited to 32 MB or 64 MB of data. However, original equipment manufacturers (OEMs) of information handling systems may desire to provide advanced firmware capabilities, resulting in a BIOS image that is too large to fit in SPI flash device 670. Information handling system can include other non-volatile flash memory devices, in addition to SPI flash device 670. For example, memory 604 can include non-volatile memory devices in addition to dynamic random access memory devices. Such memory is referred to herein as non-volatile dual in-line memory module (NVDIMM) devices. In addition, hard drive 624 can include non-volatile storage elements, referred to as a solid state drive (SSD). For still another example, information handling system 600 can include one or more non-volatile memory express (NVMe) devices. Techniques disclosed herein provide for storing a portion of a BIOS image at one or more non-volatile memory devices in addition to SPI flash device 670.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. A hybrid cooling system for an information handling system, the hybrid cooling system comprising:
 a fan structure including multiple cooling fans to provide air cooling to components of the information handling system;
 a liquid cooling system to provide liquid cooling to one or more of the components, the liquid cooling system including a first liquid line routed through an empty fan cavity of the fan structure; and
 a fan insert located within the empty fan cavity to provide a seal against air-bypass and recirculation within the information handling system.

2. The hybrid cooling system of claim 1, further comprising:
 a manifold to receive cold liquid from a radiator and to provide the cold liquid to one or more of the components via the first liquid line.

3. The hybrid cooling system of claim 1, wherein the fan insert includes:
 a notch for the first liquid line to snap fit within the fan insert.

4. The hybrid cooling system of claim 1, wherein the fan insert is substantially a same size and a same shape as the empty fan cavity.

5. The hybrid cooling system of claim 1, wherein a plurality of cooling fans remaining in the fan structure with the empty fan cavity provide sufficient air cooling for the components of the information handling system.

6. The hybrid cooling system of claim 1, wherein the fan insert is a foam material.

7. The hybrid cooling system of claim 1, wherein the fan insert is a rubber material.

8. An information handling system comprising:
 a first plurality of components;
 a second plurality of components; and
 a hybrid cooling system including:
  a fan structure including multiple cooling fans to provide air cooling to the first components of the information handling system;
  a liquid cooling system to provide liquid cooling to one or more of the second components, the liquid cooling system including a first liquid line routed through an empty fan cavity of the fan structure; and
  a fan insert located within the empty fan cavity to provide a seal against air-bypass and recirculation within the information handling system.

9. The information handling system of claim 8, wherein the hybrid cooling system further comprises a manifold to receive cold liquid from a radiator and to provide the cold liquid to one or more of the components via the first liquid line.

10. The information handling system of claim 8, wherein the fan insert includes a notch for the first liquid line to snap fit within the fan insert.

11. The information handling system of claim 8, wherein the fan insert is substantially a same size and a same shape as the empty fan cavity.

12. The information handling system of claim 8, wherein a plurality of cooling fans remaining in the fan structure with the empty fan cavity provide sufficient air cooling for the first components of the information handling system.

13. The information handling system of claim 8, wherein the fan insert is a foam material.

14. The information handling system of claim 8, wherein the fan insert is a rubber material.

15. An information handling system comprising:
 a first plurality of components;
 a central processing board including a second plurality of components;
 a graphics processing board including a third plurality of components; and
 a hybrid cooling system including:
  a fan structure including multiple cooling fans to provide air cooling to the first components of the information handling system;
  a liquid cooling system to provide liquid cooling to one or more of the second components on the central processing board and to provide liquid cooling to one or more of the third components on the graphics processing board, the liquid cooling system including:
   a first liquid line routed through a first empty fan cavity of the fan structure, the first liquid line to provide liquid cooling to the one or more of the third components; and
   a second liquid line routed through a second empty fan cavity of the fan structure, the second liquid line to provide a return liquid from the one or more of the third components;
  a first fan insert located within the first empty fan cavity to provide a first seal against air-bypass and recirculation within the information handling system; and
  a second fan insert located within the second empty fan cavity to provide a second seal against air-bypass and recirculation within the information handling system.

16. The information handling system of claim 15, wherein the hybrid cooling system further comprises:
 a manifold to receive cold liquid from a radiator and to provide the cold liquid to one or more of the third components via the first liquid line.

17. The information handling system of claim 15, wherein the first fan insert includes:
 a notch for the first liquid line to snap fit within the first fan insert.

18. The information handling system of claim 15, wherein the first fan insert is substantially a same size and a same shape as the first empty fan cavity.

19. The information handling system of claim 15, wherein a plurality of cooling fans remaining in the fan structure with the empty fan cavity provide sufficient air cooling for the first components of the information handling system.

20. The information handling system of claim 15, wherein the fan insert is a foam material.

* * * * *